United States Patent
Hublikar et al.

(10) Patent No.: US 8,728,964 B2
(45) Date of Patent: May 20, 2014

(54) GLASS COMPOSITION WITH LOW COEFFICIENT OF THERMAL EXPANSION, AND GLASS FIBER PRODUCED FROM SAME

(75) Inventors: Sudhendra V. Hublikar, Martinez, GA (US); Robert L. Hausrath, Aiken, SC (US); Anthony V. Longobardo, Johnston, SC (US)

(73) Assignee: AGY Holding Corp., Aiken, SC (US)

( * ) Notice: Subject to any disclaimer, the term of this patent is extended or adjusted under 35 U.S.C. 154(b) by 192 days.

(21) Appl. No.: 13/348,073

(22) Filed: Jan. 11, 2012

(65) Prior Publication Data

US 2012/0178610 A1 Jul. 12, 2012

Related U.S. Application Data

(60) Provisional application No. 61/431,712, filed on Jan. 11, 2011.

(51) Int. Cl.
  *C03C 3/091* (2006.01)
  *C03C 13/00* (2006.01)
  *H05K 1/03* (2006.01)

(52) U.S. Cl.
  CPC ............... *C03C 3/091* (2013.01); *C03C 13/00* (2013.01); *H05K 1/0306* (2013.01)
  USPC .............. 501/66; 501/35; 501/36; 174/258; 428/292.1; 428/197.4; 428/299.4; 428/364; 428/426

(58) Field of Classification Search
  CPC .... C03C 13/00; C03C 13/0306; C03C 3/091; H05K 1/03; H05K 1/0306; H05K 1/0313
  USPC .............. 501/35, 36, 66; 174/258; 428/292.1, 428/297.4, 299.4, 364, 426
  See application file for complete search history.

(56) References Cited

U.S. PATENT DOCUMENTS

| | | | | |
|---|---|---|---|---|
| 3,892,581 A | * | 7/1975 | Burgman et al. | 501/38 |
| 6,060,168 A | * | 5/2000 | Kohli | 428/428 |
| 2007/0265156 A1 | | 11/2007 | Peuchert et al. | |
| 2008/0009403 A1 | * | 1/2008 | Hofmann et al. | 501/55 |

FOREIGN PATENT DOCUMENTS

| | | |
|---|---|---|
| EP | 0 960 075 | 12/1999 |
| FR | 2 916 198 A1 | 11/2008 |
| FR | 2 666 082 A1 | 1/2010 |
| GB | 479173 | 1/1938 |
| WO | 98/27019 A1 | 6/1998 |
| WO | 2007/055968 A2 | 5/2007 |
| WO | 2010/075267 A1 | 7/2010 |

OTHER PUBLICATIONS

European Patent Office, PCT International Search Report and Written Opinion for International Application No. PCT/US2012/020900 dated Apr. 23, 2012.

* cited by examiner

*Primary Examiner* — Kaj K Olsen
*Assistant Examiner* — Elizabeth A Bolden
(74) *Attorney, Agent, or Firm* — Michael A. Mann; Nexsen Pruet, LLC

(57) ABSTRACT

The present disclosure relates to a glass composition having a low thermal expansion coefficient, specifically, a glass composition comprising about 55 to less than 64 weight percent of silicon oxide, about 15 to about 30 weight percent of aluminum oxide, about 5 to about 15 weight percent of magnesium oxide, about 3 to about 10 weight percent boron oxide, about 0 to about 11 weight percent calcium oxide, and about 0 to about 2 weight percent of alkali oxide, the remainder being trace compounds of less than about 1 weight percent, is provided. Glass fibers and composite articles formed therefrom are also provided.

17 Claims, No Drawings

GLASS COMPOSITION WITH LOW COEFFICIENT OF THERMAL EXPANSION, AND GLASS FIBER PRODUCED FROM SAME

CROSS-REFERENCE TO RELATED APPLICATIONS

This application claims the benefit of U.S. Provisional Application No. 61/431,712, filed Jan. 11, 2011, all of which is hereby incorporated by reference in its entirety.

TECHNICAL FIELD

The present disclosure relates to a glass composition having a low thermal expansion coefficient, and a continuous method of manufacturing a glass fiber from said glass composition.

BACKGROUND

Many conventional low thermal expansion coefficient glasses are generally found in the "borosilicate glass family." Borosilicate glasses have a low thermal expansion coefficient, about one-third to one half that of many boron-free silicate glasses. Typically, these borosilicate glass compositions are about 70-80 weight percent silica, 10-15 weight percent boron oxide, up to 8 weight percent sodium oxide, up to 8 weight percent potassium oxide, and minor amounts of calcium oxide (lime) and aluminum oxide. Borosilicate glasses are well known for their excellent thermal stability (low thermal expansion). This is primarily due to their relatively high silica and boron oxide content. These same glasses are, however, relatively difficult to melt (have high viscosity), for the same reason. In addition, these glasses tend to have relatively low elastic moduli (<70 GPa) and as a result are a poor choice for applications that require rigidity and high dimensional stability.

Printed circuit boards (PCB) necessarily require electrical, mechanical and thermal stability. If a glass fiber is used in a PCB as part of an insulative component, it is desirable for the glass to have a low thermal expansion coefficient (CTE), high elastic modulus and be free from hollow filaments (trapped bubbles within the fibers). In some situations, the glass fiber in combination with a polymer binder or matrix can provide an insulative material that closely matches the metal wiring and other components of the electronic device. A typical printed circuit board, for example, has a circuit pattern composed of an insulating layer and a metal, e.g., copper (Cu), gold (Au), or aluminum (Al). Metals, such as copper, have thermal expansion coefficient of about 17 ppm/° C. A glass fiber filler in combination with a plastic binder or matrix as an insulating layer can be used to more closely match the CTE of the metal. Ideally, the combination of glass fiber and plastic binder is of a design such that it reduces residual stress after the printed circuit boards are manufactured and reduces delamination of the insulating layers during use.

There are different types of glass fibers that currently find use in electronic circuit boards and specifically for IC chip carriers, such as E-glass, L-glass, and T-glass (a type of S-glass fiber). While S-glass may provide properties suitable for such applications, due to processing constraints, it is difficult to continuously process S-glass with low "hollow filament" count (the absence of a long hollow interior in the fiber, likely formed from trapped gas bubbles or seed crystals). E and L-glass fibers have on the one hand, very low hollow filament counts, but rather poor thermal expansion compatibility behavior and low elastic moduli. T-glass possesses both excellent thermal expansion and high modulus, but like S-glass, suffers from high hollow filament counts.

With continuous development in mounting technology demanding lower electric permittivity of materials, thinner substrates, and 3-dimensional packaging technology, and highly densified printed circuit board technology, improved low CTE glass fibers that have the required high elastic modulus and low hollow filament characteristics are needed that are more readily and more economically manufacturable, while still suitable for fiberization.

SUMMARY

The present disclosure provides a glass composition having a low coefficient of thermal expansion (CTE) in combination with a low glass viscosity profile and high elastic modulus. The glass composition is suitable for economical, continuous manufacturing of fibers with low hollow filament content therein. The low CTE fibers are particularly suitable for use in insulating layers of PCB, chip carrier substrates and/or controlled collapse (C4) ball grid array (BGA) connectors. The thermal expansion coefficient, elastic modulus and potential for hollow filaments of an insulating layer of a printed circuit board can be controlled to a great extent by the instant compositions herein disclosed that are economically suitable for forming glass fiber.

The present disclosure is to further provide a glass fiber, an insulating layer of a laminated circuit board, and a printed circuit board manufactured by employing the glass fiber of said composition having a low thermal expansion coefficient.

According to an embodiment disclosed and described herein, a glass composition suitable for fiberization and having a low CTE is of a relatively low boron content. For example, the glass composition disclosed herein has a boron oxide content of less than about 10 weight percent and a silica content less than about 65 weight percent, yet still provides acceptable CTE properties suitable for use in electronics.

Thus, in one aspect, a glass composition having about 55 to about 65 weight percent of silicon oxide, about 15 to about 30 weight percent of aluminum oxide, about 5 to about 15 weight percent of magnesium oxide, about 3 to about 10 weight percent boron oxide, about 0 to about 11 weight percent calcium oxide, and about 0 to about 2 weight percent of alkali oxide, the remainder being trace compounds of less than about 1 weight percent, is provided.

In another aspect, a glass composition consisting essentially of about 57 to about 63 weight percent of silicon oxide, about 17 to about 25 weight percent of aluminum oxide, about 7 to about 12 weight percent of magnesium oxide, about 4 to about 6 weight percent boron oxide, less than about 5 weight percent calcium oxide, and about 1 to about 2 weight percent of alkali oxide, the remainder being trace compounds of less than about 1 weight percent, is provided.

According to another embodiment disclosed and described herein, a glass fiber manufactured by employing the glass composition is provided.

According to another embodiment disclosed and described herein, is provided an insulating polymer binder or matrix of a laminated circuit board, the polymer binder or matrix including the glass fiber manufactured by employing the glass composition disclosed herein.

According to another embodiment disclosed and described herein, is provided a printed circuit board comprising an insulating polymer binder or matrix comprising a glass fiber manufactured by employing the glass composition described herein; and a circuit pattern formed on the insulating polymer binder or matrix of a printed circuit board.

According to another embodiment disclosed and described herein, is provided a transparent fiberglass reinforced composite article comprising: a glass fiber composition comprising glass fiber as disclosed herein and a polymer matrix having an index of refraction that differs from that of the glass fiber composition by less than 0.005, whereby the fiberglass reinforced composite article is substantially transparent to transmitted light, e.g., visible light.

DETAILED DESCRIPTION

While the present disclosure has been described with reference to particular embodiments, it is to be appreciated that various changes and modifications may be made by those skilled in the art without departing from the spirit and scope of the present disclosure, as defined by the appended claims and their equivalents.

A glass composition according to an embodiment disclosed and described herein having about 55 to about 65 weight percent of silicon oxide, about 15 to about 30 weight percent of aluminum oxide, about 5 to about 15 weight percent of magnesium oxide, about 3 to about 10 weight percent boron oxide, about 0 to about 11 weight percent calcium oxide, and about 0 to about 2 weight percent of alkali oxide, the remainder being trace compounds of less than about 1 weight percent, is provided.

Boron oxide typically acts as a fluxing agent in glass compositions. In proper amounts, boron oxide lowers the melting temperature without increasing the CTE of the glass. When levels of B2O3 less than 3 weight percent are used, the glass viscosity is too high for easy melting and fining. At levels above 10 weight percent B2O3, the elastic modulus decreases, making the fiber's mechanical behavior less desirable. In addition, boron volatility also becomes a problem. Thus, boron oxide is preferably used within a range of about 3 to about 10 weight percent, preferably 4 to 6 weight percent, and most preferably, about 5 weight percent +/− about 0.25 weight percent.

Likewise, when the amount of silicon oxide is used more than the disclosed range, the melting temperature of the glass composition may become too high. Glasses with high viscosities are typically more difficult to fine (remove gaseous bubbles, etc.) and therefore are more prone to hollow filaments. On the other hand, when the amount is used less than the disclosed range, it may be difficult to obtain a desired thermal expansion coefficient of the glass composition. In addition, these types of glasses are prone to devitrification (have poor liquidus temperatures in relation to the fiber forming temperature) and therefore small delta T (ΔT) values. Small delta T values equate to a small operating window, leading to manufacturing difficulties.

Likewise, when the amount of aluminum oxide is used more than the disclosed range, the elastic modulus improves but the melting temperature of the glass composition may become too high. On the other hand, when the amount is used less than the disclosed range, modulus deteriorates. Alumina content is critical because it also influences the devitrification behavior of the glass (delta T) and that directly influences manufacturability and process cost.

According to an embodiment disclosed and described herein, the glass composition may further include about 0 to about 2 weight percent of alkali oxide. The alkali oxide can be chosen from sodium oxide, lithium oxide and potassium oxide.

According to an embodiment disclosed and described herein, the glass composition includes about 0 to about 2 weight percent of sodium oxide and lithium oxide, and essentially no added potassium oxide, e.g. less than 0.05 weight percent potassium oxide. The alkaline metal oxides are a useful fluxing agent for the glass composition capable of lowering the glass melt viscosity (temperature), but when used in an excess amount, alkaline metal oxides may significantly increase the CTE beyond the desired limit as well as deteriorate the chemical durability of the glass composition. Low glass viscosity is important for good fining and for providing for low hollow filament content fibers. More than 2 weight percent alkalis can also worsen devitrification behavior.

According to another aspect disclosed and described herein, a glass fiber is prepared by using the glass composition disclosed and described is provided. As described above, the glass composition disclosed and described herein has certain processing parameters as described below so that it is relatively economical and productive to form the glass composition into the glass fiber.

According to another aspect disclosed and described herein, an insulating polymer binder or matrix suitable for use in a printed circuit board is provided. The insulating polymer binder or matrix comprises the glass fiber in which the glass fiber as disclosed herein is dispersed, distributed or suspended.

According to another aspect disclosed and described herein, a printed circuit board or printed circuit board assembly, including the insulating polymer binder or matrix of a printed circuit board or assembly and/or a circuit pattern formed on the insulating polymer binder or matrix of the printed circuit board or assembly, is provided. The insulating polymer binder or matrix comprises the glass fiber as disclosed herein in which the glass fiber is dispersed, distributed or suspended.

According to another aspect disclosed and described herein, a transparent composite comprising the instant glass fiber in combination with a transparent polymer matrix is provided. The composite is configured such that the fiber and the polymer matrix have a difference in index of refraction of less than 0.005, is provided. Such transparent composites are suitable as transparent armor, windshields and/or other automotive or aircraft transparencies.

The instant glass fiber has a lower thermal expansion coefficient as well as higher elastic modulus than both conventional E-glass fiber and L-Glass fiber, while providing manufacturability advantages over E-Glass and L-Glass. The instant glass fiber has much lower CTE than E-Glass or L-Glass. The lower thermal expansion coefficient of the instant glass fiber provides improved compatibility with insulating polymer binder or matrix materials for circuit boards or assemblies, chip carrier substrates, (e.g., ball grid arrays) and/or connectors.

The instant glass fiber has a very desirable combination of benefits when compared to conventional glass fibers. For example, the instant glass fiber has a CTE and elastic modulus properties that are only slightly inferior to S-Glass. However, the instant glass fiber is comparatively a much easier glass to melt and fine, thus allowing continuous production of essentially hollow-filament-free fibers.

A glass fiber is typically formed by melting a glass composition at 1000° C. or higher and then passing through the melted composition through a nozzle. The instant glasses disclosed and described herein are suitable for melting in traditional commercially available refractory-oxide lined glass melters that are widely used in the manufacture of glass reinforcement fibers, in what is commonly called a direct-melt process. The instant glasses disclosed and described herein can also be suitably formed in refractory metal- and refractory metal alloy lined melters.

The glass batch disclosed and described herein is melted, in some instances using a glass melting furnace made from appropriate refractory materials such as alumina, chromic oxide, silica, alumina-silica, zircon, zirconia-alumina-silica, or similar oxide based refractory materials, or is refractory metal- and refractory metal alloy lined. Often, such glass melting furnaces include one more bubblers and/or electrical boost electrodes. The bubblers and/or electrical boost electrodes increase the temperature of the bulk glass and increase the molten glass circulation under the batch cover.

Thus, the melted glass composition disclosed herein is delivered to a bushing assembly from a forehearth. The bushing includes a tip plate with a plurality of nozzles, each nozzle discharges a stream of molten glass, which are mechanically drawn to form continuous filaments. The glass fibers according to the instant disclosure are obtainable from the glasses of the composition described as above to provide a large number of streams of molten glass flowing out of a large number of orifices located in the base of one or more bushings that are attenuated into the form of one or more groups of continuous filaments and then these strands are combined into one or more fibers, which are collected on a moving support. This may be a rotating support, when the fibers are collected in the form of wound packages, or in the form of a support that moves translationally when the fibers are chopped by a device that also serves to draw them or when the fibers are sprayed by a device serving to draw them, so as to form a mat.

Having generally described this instant disclosure, a further understanding can be obtained by reference to certain specific examples illustrated below which are provided for purposes of illustration only and are not intended to be all inclusive or limiting unless otherwise specified.

EXAMPLES

Table 1 presents examples of low CTE glass compositions suitable for fiberization.

TABLE 1

Compositions of low CTE glasses disclosed herein.

| Example | $SiO_2$ | $Al_2O_3$ | MgO | $B_2O_3$ | $Li_2O$ | $Na_2O$ | $Fe_2O_3$ | $TiO_2$ | CaO | $K_2O$ |
|---|---|---|---|---|---|---|---|---|---|---|
| 1 | 62.33 | 22.55 | 9.28 | 4.75 | 0.95 | <0.03 | 0.04 | 0.02 | 0.09 | |
| 2 | 61.38 | 22.92 | 9.43 | 5.02 | 0.99 | 0.05 | 0.05 | 0.02 | 0.10 | 0.01 |
| 3 | 60.94 | 22.94 | 9.39 | 5.47 | 0.99 | 0.05 | 0.05 | 0.02 | 0.10 | 0.01 |
| 4 | 61.14 | 23.18 | 9.49 | 5.18 | 0.77 | 0.04 | 0.05 | 0.02 | 0.10 | 0.01 |
| 5 | 61.30 | 23.14 | 9.17 | 5.37 | 0.79 | 0.05 | 0.05 | 0.02 | 0.09 | 0.01 |
| 6 | 61.34 | 23.10 | 9.44 | 5.49 | 0.50 | | 0.04 | 0.02 | 0.08 | |
| 7 | 60.79 | 22.56 | 9.08 | 5.77 | 0.90 | 0.05 | 0.06 | 0.02 | 0.72 | 0.2 |

Table 2 presents the measured physical properties of the compositions of Table 1. Examples 1-6 were found to have low CTE values, less than about 3.6 while having high elastic modulus. CTE values were measured with a dilatometer and are reported over a temperature range from 25 to 300° C.

TABLE 2

Measured physical properties of low CTE glasses disclosed herein.

| Example | CTE ($\times 10^{-6}$/ °C.) | $T_g$ (°C.) | $T_d$ (°C.) | Elastic Modulus E (GPa) | Density (g/cm$^3$) |
|---|---|---|---|---|---|
| 1 | 3.6 | 700 | 770 | 90.2 | 2.45 |
| 2 | 3.5 | 705 | 775 | 89.2 | 2.45 |
| 3 | 3.5 | 715 | 780 | 89.2 | 2.44 |
| 4 | 3.5 | 729 | 785 | 89.5 | 2.45 |
| 5 | 3.3 | 715 | 790 | 89.6 | 2.46 |
| 6 | | | | 90.8 | 2.45 |

Table 3 presents the measured processing parameters for the glass compositions of Table 1. The Examples 1-6 had acceptable manufacturable delta T values of between 30-about 50° C. When these glasses were held at temperatures below the liquidus temperature for long periods of time devitrifacation with Cordierite as the primary phase was observed. Moreover, the glass compositions above presented liquidus temperatures unexpectedly low, about 1320° C. to about 1370° C. (~2420-2500° F.).

TABLE 3

Measured processing parameters of low CTE glasses disclosed herein.

| Example | $T_2$ (°C.) | $T_{2.5}$ (°C.) | $T_3$ (°C.) | Liquidus Temp. (°C.) | $\Delta T_{2.5}$ (°C.) | $\Delta T_3$ (°C.) |
|---|---|---|---|---|---|---|
| 1 | 1584 | 1472 | 1379 | 1332 | 140 | 47 |
| 2 | 1576 | 1465 | 1371 | 1329 | 136 | 42 |
| 3 | 1570 | 1459 | 1366 | 1325 | 134 | 41 |
| 4 | | | | 1339 | | |
| 5 | | | | 1337 | | |
| 6 | 1603 | 1489 | 1397 | 1367 | 122 | 30 |

Table 4 is a listing of comparative physical parameters for glasses that are provided in fiber form.

TABLE 4

Comparative Examples of Glasses.

| | | L-Glass | E-Glass | S-Glass | Examples 1-6 |
|---|---|---|---|---|---|
| Dielectric Constant, $\in'$, (Dk) | 1 GHz | 4.79+ | 7.30** | 5.3 | <5 |

TABLE 4-continued

Comparative Examples of Glasses.

|  |  | L-Glass | E-Glass | S-Glass | Examples 1-6 |
|---|---|---|---|---|---|
| Density (bulk annealed) | g/cm3 | 2.30 | 2.63 | 2.49 | 2.45 |
| Refractive Index (fiber) |  | 1.480 | 1.558 | 1.546 | 1.516 to 1.520 |
| Softening Point | °C. | 740 | 846 | 1056 | 770-790 (Td) |
| Coefficient of thermal Expansion | ppm/°C. | 3.90 | 5.40 | 2.9 | 3.3 to 3.6 |
| Elastic Modulus | GPa | 62 | 77 | 95 | 89-90 (bulk) |

NOTES:
+Measured using HP LCR meter and HP 16453A fixture per IPC -TM-650 (2.5.5.9).
Measured using Long Stripline technique per IPC-TM-650 (2.5.5.5.1).
**Average data for E-Glass measured by IPC 3-12 d Task Group.
@ Average tensile load to failure for L-Glass fiber (D510) vs. E-Glass (D450).
^ Determined by sonic pulse echo technique on bulk annealed samples.

The terms used in the aforementioned description are intended to describe certain embodiments only, and shall by no means restrict the present disclosure. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

While the present disclosure has been described with reference to particular embodiments, it is to be appreciated that various changes and modifications may be made by those skilled in the art without departing from the spirit and scope of the present disclosure, as defined by the appended claims and their equivalents.

What is claimed:

1. A glass composition comprising the following compounds in the listed weight percent:

| $SiO_2$ | 60-62.9 |
|---|---|
| $Al_2O_3$ | 22.0-23.7 |
| MgO | 8.6-10.0 |
| $B_2O_3$ | 4.2-10 |
| $Li_2O$ | <2 |
| $Na_2O$ | <0.1 |
| CaO | <1 |
| $K_2O$ | <0.1 | with the residual elemental composition being less than 1 weight percent.

2. The glass composition of claim 1, wherein the weight percent ratio of $Al_2O_3$/MgO is greater than 2.3.

3. The glass composition of claim 1, wherein the glass composition has a liquids temperature between 1320° C. to 1370° C.

4. The glass composition of claim 1, wherein a glass produced therefrom has a CTE of between 3.0 and $3.6 \times 10^{-6}$/°C.

5. A glass fiber product manufactured by using the glass composition of claim 1, being substantially hollow-filament free.

6. An insulating polymer binder or matrix for a printed circuit board assembly comprising a polymer binder or matrix comprising a glass fiber of the glass composition of claim 1.

7. A printed circuit board comprising an insulating polymer binder or matrix comprising a glass fiber of the glass composition of claim 1 and a circuit pattern formed thereon.

8. A windshield, windscreen, canopy, or transparency comprising the glass fiber of claim 1.

9. A glass composition comprising the following compounds in the listed weight percent:

| $SiO_2$ | >60 and <62 |
|---|---|
| $Al_2O_3$ | >17 and <23 |
| MgO | >8.5 and <10 |
| $B_2O_3$ | >5 and <10 |
| $Li_2O$ | <2 |
| $Na_2O$ | <0.05 |
| CaO | <1 |
| $K_2O$ | <0.05 | with the residual elemental cot position being less than 1 weight percent.

10. A glass fiber product manufactured by using the glass composition of claim 9, being substantially hollow-filament free.

11. An insulating polymer binder or matrix for a printed circuit board assembly comprising a polymer binder or matrix comprising a glass fiber of the glass composition of claim 9.

12. A printed circuit board comprising an insulating polymer binder or matrix comprising a glass fiber of the glass composition of claim 9 and a circuit pattern formed thereon.

13. A transparent fiberglass reinforced composite article comprising a glass fiber composition comprising the following compounds in the listed weight percent:

| $SiO_2$ | 60-62.9 |
|---|---|
| $Al_2O_3$ | 22.0-23.7 |
| MgO | 8.6-10.0 |
| $B_2O_3$ | 4.2-10 |
| $Li_2O$ | <2 |
| $Na_2O$ | <0.1 |
| CaO | <1 |
| $K_2O$ | <0.1 | the remainder of said glass fiber composition being trace compounds of less than 1 weight percent; and
a polymer matrix.

14. The transparent fiberglass reinforced composite article of claim 13, wherein the weight percent ratio of $Al_2O_3$/MgO is greater than 2.3.

15. A windshield, windscreen, canopy, or transparency comprising the transparent fiberglass reinforced composite article of claim 13.

16. The transparent fiberglass reinforced composite article of claim 13 wherein the glass fiber composition has an index of refraction that differs from that of the polymer matrix by less than 0.005.

17. The transparent fiberglass reinforced composite article comprising a class fiber composition comprising the following compounds in the listed weight percent:

| | |
|---|---|
| $SiO_2$ | >60 and <62 |
| $Al_2O_3$ | >17 and <23 |
| MgO | >8.5 and <10 |
| $B_2O_3$ | >5 and <10 |
| $Li_2O$ | <2 |
| $Na_2O$ | <0.05 |
| CaO | <1 |
| $K_2O$ | <0.05 | with the residual elemental composition being less than 1 weight percent; and
a polymer matrix.

* * * * *